US006864732B2

(12) United States Patent
Chalasani

(10) Patent No.: US 6,864,732 B2
(45) Date of Patent: Mar. 8, 2005

(54) FLIP-FLOP CIRCUIT WITH REDUCED POWER CONSUMPTION

(75) Inventor: Prasad H. Chalasani, San Jose, CA (US)

(73) Assignee: Procket Networks, Inc., Milpitas, CA (US)

( * ) Notice: Subject to any disclaimer, the term of this patent is extended or adjusted under 35 U.S.C. 154(b) by 0 days.

(21) Appl. No.: 10/298,840

(22) Filed: Nov. 18, 2002

(65) Prior Publication Data

US 2004/0095175 A1 May 20, 2004

(51) Int. Cl.[7] ................................................ H03K 3/289

(52) U.S. Cl. ......................... 327/203; 327/210; 327/99; 326/93; 326/95

(58) Field of Search .............................. 326/43, 93, 95, 326/98; 327/201–203, 208–218

(56) References Cited

U.S. PATENT DOCUMENTS 5,570,051 A * 10/1996 Chiang et al. .............. 327/203
5,612,632 A * 3/1997 Mahant-Shetti et al. ...... 326/46
5,774,005 A * 6/1998 Partovi et al. .............. 327/210

* cited by examiner

*Primary Examiner*—Vibol Tan
(74) *Attorney, Agent, or Firm*—Dorsey & Whitney LLP

(57) ABSTRACT

A low power flip-flop is disclosed. The number of transistors which are coupled to the clock signal is reduced by more than half when compared with known flip-flop designs. The flip-flop comprises a pair of clocked transistors forming a pass gate and a plurality of inverters coupled thereto. By reducing the number of clock signal connections needed for reliable operation, the present invention reduces the power consumed by the flip-flop when operating at typical levels of activity by up to 70%.

11 Claims, 3 Drawing Sheets

FLIP-FLOP CIRCUIT WITH REDUCED POWER CONSUMPTION

FIELD OF THE INVENTION

The present invention relates broadly to logic circuit design and fabrication. It specifically relates to the design and fabrication of flip-flop circuits in Very Large Scale Integrated Circuits (VLSI).

BACKGROUND OF THE INVENTION

Flip-flop circuit elements are known and widely used in VLSI integrated circuit (IC) design. Flip-flop circuit elements act as digital storage devices, receiving digital data (logic 1 or 0) at their input, storing the digital data and then providing the stored digital data as output when queried. These tasks of receiving, storing and generating output are synchronized by a clock signal.

Depending upon the application, the clock signal may have a frequency of from several megahertz to several Gigahertz. In typical operations, a flip-flop receives data when the clock signal is either low or high, stores the data when the clock signal transitions from low to high or vice versa and generates its output during the clock signal's high or low state.

All flip-flop activity consumes power. Given that the clock runs continuously, the power consumption by flip-flops accounts for a very significant portion of the entire IC's power consumption. As the frequency of operation and complexity of ICs is likely to increase as IC feature size shrinks, the power consumption of flip-flop circuit elements is also likely to increase significantly.

The total power consumption for any given complementary metal oxide semiconductor (CMOS) IC can be stated as:

$$P_{total}=P_{act}+P_{sc}+P_{leak};$$

where $P_{total}$ is the total power consumed by the CMOS IC;

$P_{act}$ is the power consumed during switching activity (this is the major component of total power consumption);

$P_{sc}$ is the power consumed by short circuit currents. These current flow from power supply to ground when gate inputs transition (typically these are a minor component of total power consumption and will not be discussed further); and $P_{leak}$ is the power consumed by leakage currents (these currents are process related, usually a negligible component of total power consumption and require no further discussion here).

For flip-flop circuits, $P_{act}$ has two components. These are:

$$P_{act}=P_{clk}+P_{data};$$

where $P_{clk}$ represents the power consumption due to clock switching activity; and $P_{data}$ represents the power consumption due to data switching activity.

In turn, both $P_{clk}$ and $P_{data}$ can be further defined as:

$$P_{clk}=(C_{clk}*V^2*\text{freq});$$

and $$P_{data}=(C_{data}*V^2*\text{freq})*AF;$$

where $C_{clk}$ is the total charging and discharging capacitance of the clock signal;

$C_{data}$ is the total charging and discharging capacitance of the data signal;

freq is the clock frequency;

AF is the average data activity factor and typically has a value of from 5 to 10%; and V is the operating voltage.

In most applications, the average data activity factor (AF) is about 10% of the clock frequency. Consequently, a majority of the power consumption in a flip-flop circuit is consumed by clock switching. As the clock operates continuously, the activity factor of clock switching is 100%.

Although one method for reducing the power consumption is to reduce the operating voltage, this reduction typically results in less reliable operation, as operating margins are reduced. Reducing the switching capacitance that is controlled or triggered by the clock signal and the short circuit current of the clock is thus the most direct method of reducing power consumption in a flip-flop circuit.

A flip-flop design that limits the amount of clock capacitance and short-circuit current without affecting the flip-flop's performance would be highly desirable.

SUMMARY OF THE INVENTION

A new flip-flop design which greatly reduces clock capacitance and eliminate short-circuit current is described herein. Both these performance goals are accomplished without sacrificing the performance of the flip-flop. In the design shown and claimed herein, clock capacitance in a flip-flop is reduced by about 70% and the short circuit current has been completely eliminated. This flip-flop design uses differential signals to store and retrieve data. Only 4 transistors are coupled to the clock signal, as opposed to 10 transistors in a common, known CMOS flip-flop design. Reading and writing data are just as reliable in this flip-flop as they are in known designs.

DETAILED DESCRIPTION OF THE PREFERRED EMBODIMENT

Figure 1A:
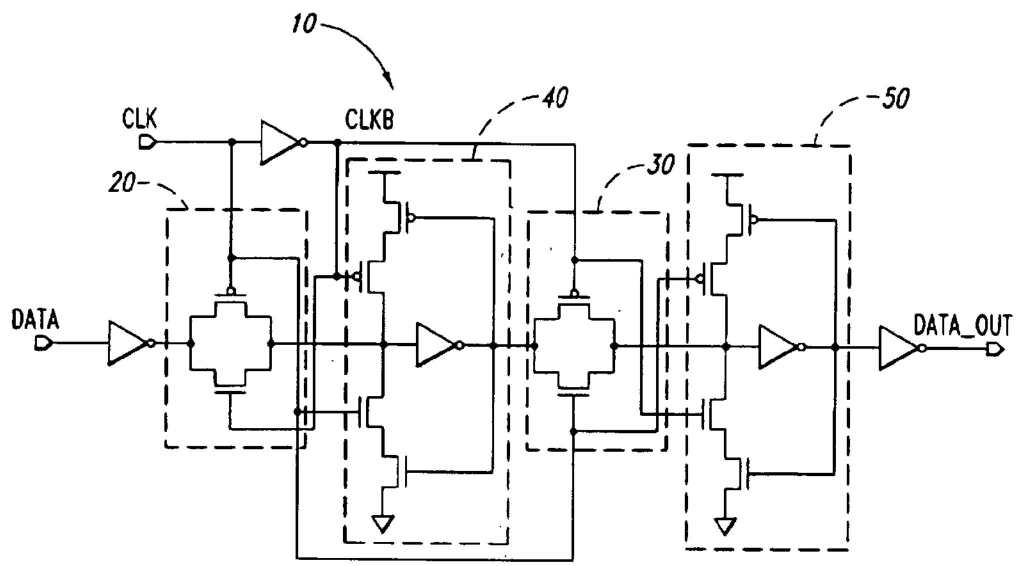
FIGS. 1_a_ and 1_b_ illustrate known flip-flop designs.

FIGS. 1_a_ and 1_b_ illustrate a known flip-flop circuit, also called a master-slave flip-flop. In the illustrated circuits of FIGS. 1_a_ and 1_b_, like components are labeled with the same part numbers. Master-slave flip-flop 10 is comprised of CMOS transmission gates 20 and 30 and memory elements 40 and 50. Each CMOS transmission gate is comprised of an n-channel and a p-channel transistor, the gates of each transistor being coupled to either the CLK or CLK complement signal. Similarly, each memory element is comprised of two n-channel transistors and two p-channel transistors. Two of these four transistors in the memory element, one n-channel transistor and one p-channel transistor are coupled to the CLK or CLK complement signal. Thus, regardless of actual storage needs, ten transistors are switched on and off during each clock cycle in master-slave flip-flop 10.

These known flip-flops also have only one pathway from the CMOS transmission gates into the memory elements.

The full voltage interval (maximum positive voltage to either ground or the maximum negative voltage), commonly called the "rail-to-rail voltage swing" is needed to transmit data reliably into the memory elements.

These flip-flops need both true and complement clock signals to read and write data to the flip-flop reliably. This results in a very high switching capacitance. As shown in FIG. 1*b*, the clock signal can be buffered by an inverter 75 to generate the complement signal and to reduce the input pin capacitance. This extra buffer, however, contributes to the total short-circuit current and also increases the overall clock capacitance. In both illustrated flip-flops (FIGS. 1*a* and 1*b*), ten (10) transistors are connected to one or another of the clock signal's true and complement signals. The necessary lines to accomplish this signal routing add further to the total clock capacitance. These factors, the clocking capacitance, the short circuit currents and the routing capacitances inside the flip-flops as well as outside them, together account for approximately 60% of a logic IC's total power consumption.

Figure 1B:
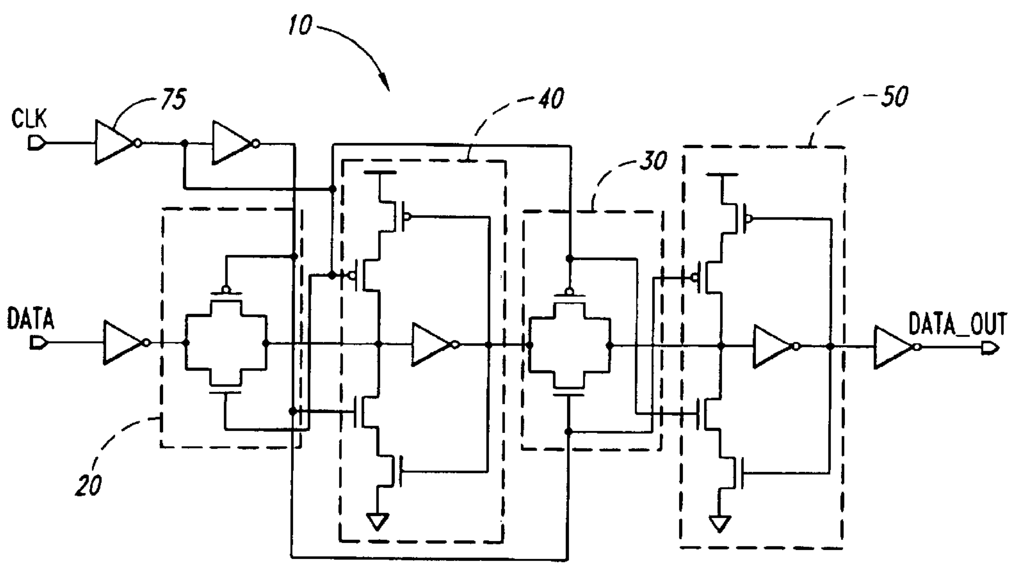
Figure 2A:
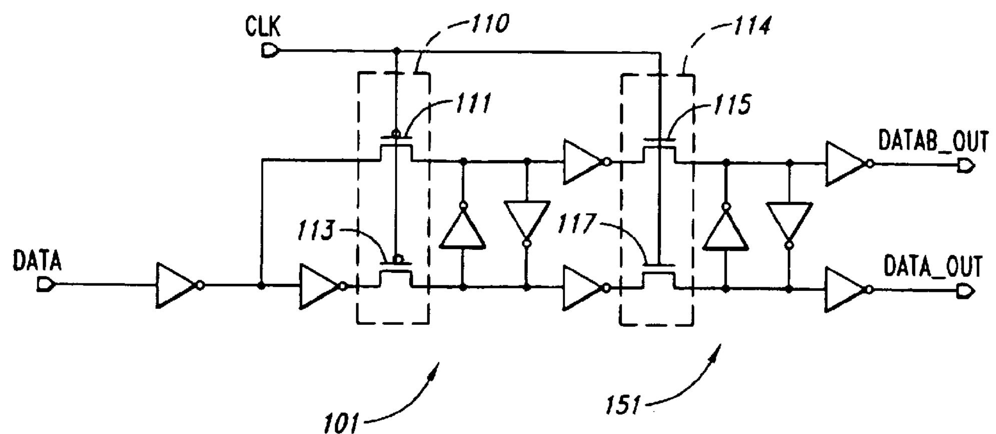
FIGS. 2_a_ and 2_b_ illustrate a first and a second embodiment of the present invention.
Figure 2B:
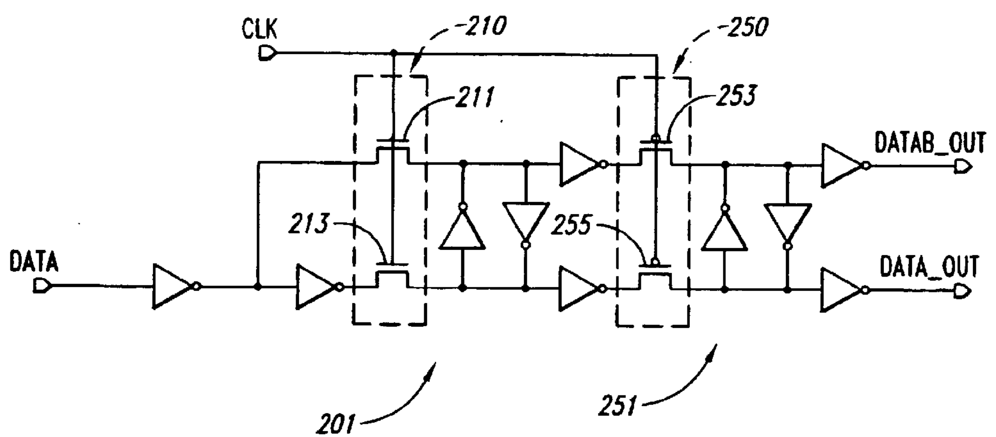

FIGS. 2*a* and 2*b* illustrate master-slave flip-flops constructed according to the present invention. As with FIGS. 1*a* and 1*b*, components that are the same in both FIGS. 2*a* and 2*b* have the same number.

Each flip-flop comprises pass gates and memory elements. The pass gates are each comprised of two transistors of the same type, either p-channel or n-channel. As shown in FIGS. 2*a* and 2*b*, if the first pass gate comprises p-channel transistors, the second pass gate in the master-slave flip-flop will comprise n-channel transistors or visa versa. As the pass gates have only one type of transistor, an inverted clock signal is not needed for the gates to operate.

In FIG. 2*a*, an incoming data bit is read during the clock low phase using pass gate 110, comprised of p-channel transistors 111 and 113. When the clock transitions from low to high, the data is stored within master flip-flop 101. During the clock high phase, the data is sent out through pass gate 114, comprised of n-channel transistors 115 and 117, which form part of slave flip-flop 151. Both master and slave flip-flops 101 and 151 use differential data and utilize appropriate pass gates (p-channel pass gates for master flip-flop 101 and n-channel pass gates for slave flip-flop 151). Due to differential data signaling, a full CMOS transmission gate is not needed. The p-channel gates of pass gate 110 always pass "1" reliably and the differential signals ensure that the data is written reliably.

In FIG. 2*b*, an incoming data bit is read during the clock high phase using pass gate 210, comprised of n-channel transistors 211 and 213. When the clock transitions from high-to-low, the data is stored inside master flip-flop 201. During the clock low phase, the data is sent out through pass gate 250, comprised of p-channel transistors 253 and 255, which form part of slave flip-flop 251. Both master and slave flip-flops 201 and 251 use differential data and utilize appropriate pass gates (n-channel pass gates for master flip-flop 201 and p-channel pass gates for slave flip-flop 251). Due to differential data signaling, a full CMOS transmission gate is not needed. The n-channel gates of pass gate 210 always pass "0" reliably and the differential signals ensure that the data is written reliably.

The circuit does not need complementary clock signals, eliminating both the need for a clock signal buffer and its related short circuit current. As the pass gates (FIGS. 2*a* and 2*b*) are small compared to CMOS transmission gates (see FIGS. 1*a* and 1*b*) and as the clock signal is only coupled to four transistors instead of the ten transistors of the master-slave flip-flop illustrated in FIGS. 1*a* and 1*b*, a great deal of the clock's capacitance is eliminated. This reduction in capacitance can be as much as 70%, which translates to a power-savings of almost 50% over known flip-flop designs, When data is not being switched, the power consumption within the cell is zero. This results from the present invention using jammed latches instead of clock gated latches.

Another benefit is that the wire routing for the clock signal is greatly simplified and its capacitance similarly reduced.

EXAMPLE

Assume a microprocessor with 500,000 flip-flop circuits that operates at a frequency of 500 MHz and a power supply voltage of 1.8 V.

Using the flip-flop design shown in FIG. 1*a*, wherein the clock capacitance of each flip-flop is typically 20 ff, the power consumption will be:

$$P_{clk}=20e^{-15}f*1.8\ V^2*500\ MHz*500{,}000=16.2\ watts.$$

Using the design shown in FIG. 2*a*, wherein the clock capacitance of each flip-flop is typically 6 ff, the power consumption will be:

$$P_{clk}=6e^{-15}f*1.8\ V^2*500\ MHz*500{,}000=4.86\ watts.$$

In this example, the power savings is almost 70%.

A careful count of the transistors needed to implement the designs shown in FIGS. 2*a* and 2*b* indicates that the present invention's flip-flop uses either the same number or very nearly the same number of transistors as the known flip-flop designs shown in FIGS. 1*a* and 1*b*. The power reduction advantages of the present invention are realized by minimizing the number of transistors that are coupled to and receive the clock signal to only the four transistors that make up the differential pairs in the master and slave flip-flops, respectively. It should be noted that the transistors and inverters illustrated in FIGS. 2*a* and 2*b* comprise known semiconductor designs and can be implemented in any one of several known semiconductor processes.

Figure 3:
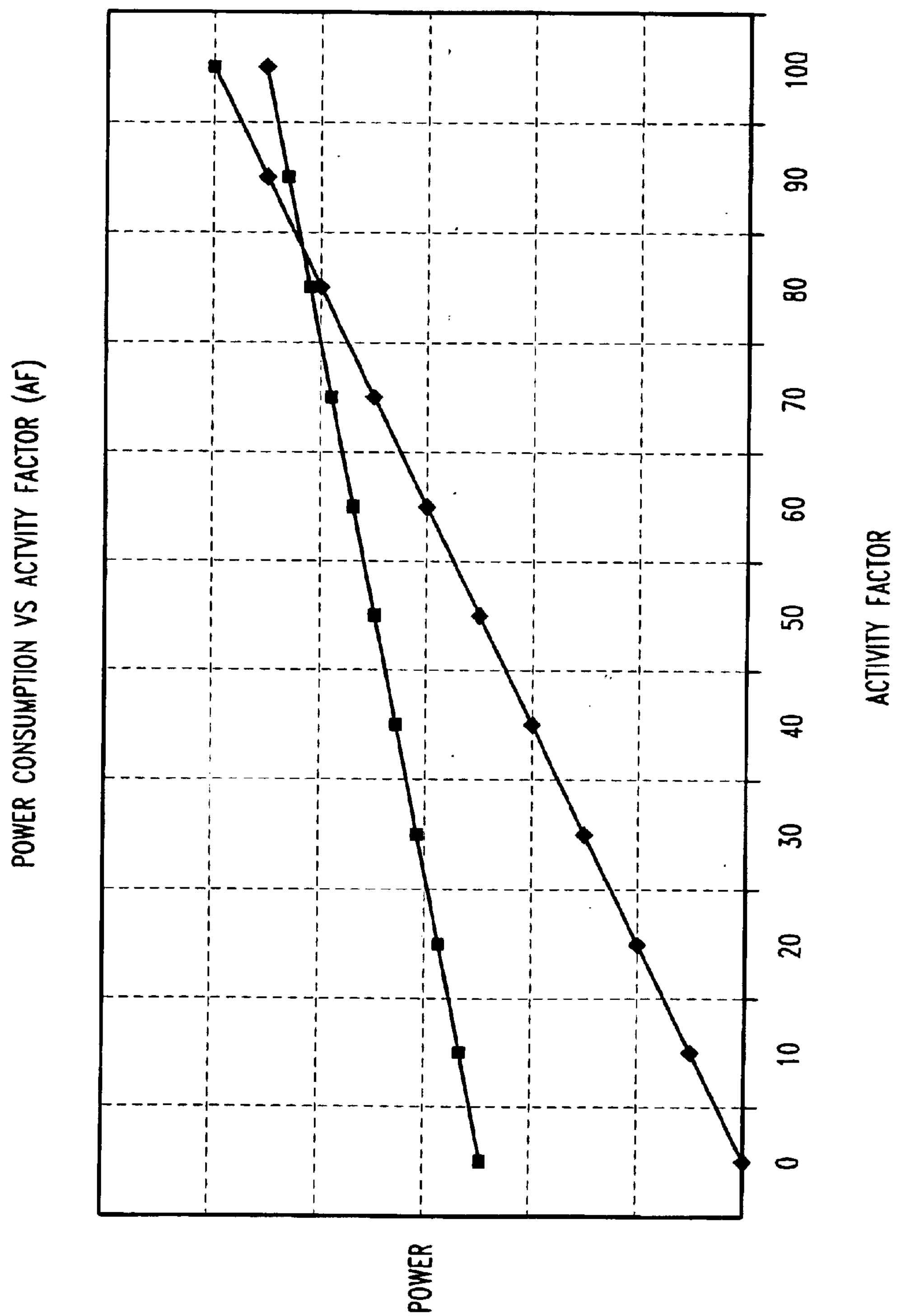
FIG. 3 is a graph of how power consumption varies with the activity factor of both known flip-flops and the flip-flops newly disclosed herein.

FIG. 3 graphs the relative power consumption of known flip-flops (curve 310) and flip-flops constructed as taught herein (curve 320). As FIG. 3 is intended only to illustrate the relative power consumption of these two types of flip-flops, no units are necessary on the graph's axis. As shown in FIG. 3, at a certain activity level, the present invention uses as much power or more than known flip-flop designs. The level of activity where the advantages of the present invention's design are lost is quite high, somewhere between 70–90%. Such levels of activity almost never occur in processors. For typical ranges of activity, the present invention offers significant power savings over known flip-flop designs.

What is claimed is:

1. A flip-flop having a clock signal input and a data signal input, the flip-flop comprising:

a pass gate; and a memory element, wherein the pass gate comprises a first and a second transistor of the same type, the gates of both transistors being coupled to the clock signal, the source of the first transistor being coupled to the data signal, the source of the second transistor being coupled to a complement data signal and the drains of both transistors being coupled to the memory element.

2. The flip-flop of claim 1 wherein the first and second transistor are n-channel transistors.

3. The flip-flop of claim 1 wherein the first and second transistor are p-channel transistors.

4. A flip-flop having a clock signal input and a data signal input, the flip-flop comprising:

a pass gate; and a memory element, wherein the memory element is comprised of a plurality of inverters including four inverters, each inverter having an input and an output, the output of the first inverter and the inputs of the second and third inverters being coupled to the data signal, the output of the second inverter and the input of the first and fourth inverter being coupled to a data complement signal, the output of the third and the fourth inverters comprising the flip-flop output signal and output complement signal respectively.

5. The flip-flop of claim 1 wherein the memory element comprises a plurality of inverters.

6. The flip-flop of claim 5 wherein the memory element is comprised of four inverters, each inverter having an input and an output, the output of the first inverter and the inputs of the second and third inverters being coupled to the data signal, the output of the second inverter and the input of the first and fourth inverter being coupled to a data complement signal, the output of the third and the fourth inverters comprising the flip-flop output signal and output complement signal respectively, the drains of the first and second transistors being coupled respectively to the input and output of the first inverter.

7. A master-slave flip-flop circuit having a clock signal input and a data signal input, the master-slave flip-flop comprising a first and a second flip-flop, each flip-flop comprising:

a pass gate; and a memory element, wherein an output of the first flip-flop is coupled to an input of the second flip-flop;

wherein the pass gate of each flip-flop is comprised of a first and second transistor of the same type.

8. The master-slave flip-flop of claim 7 wherein each pass gate comprises a first and a second transistor of the same type, the gates of both transistors in both pass gates being coupled to the clock signal, the source of the first transistor in the first pass gate being coupled to the data signal, the source of the second transistor in the first pass gate being coupled to a complement data signal, the source of the first transistor in the second pass gate being coupled to the output of the first flip-flop and the source of the second transistor in the second pass gate being coupled to the output complement of the first flip-flop and the drains of both transistors in the first and second pass gates being coupled to the memory element.

9. The master-slave slip-flop of claim 7 wherein the memory element comprises a plurality of inverters coupled to the pass gates.

10. A method for storing data in a flip-flop, the method comprising the steps of:

opening a pass gate using a clock signal; and driving a differential data signal into the flip-flop;

wherein the pass gate is comprised of two transistors of the same type, whereby the clock signal opens both transistors, allowing a differential data signal that is applied to the sources of the transistors to be clocked into the flip-flop.

11. The method of claim 10 wherein the clock signal is only applied to the gates of the two transistors.

* * * * *